US011866453B2

(12) United States Patent
Romero

(10) Patent No.: US 11,866,453 B2
(45) Date of Patent: *Jan. 9, 2024

(54) SCANDIUM PRECURSOR FOR SC$_2$O$_3$ OR SC$_2$S$_3$ ATOMIC LAYER DEPOSITION

(71) Applicant: Intel Corporation, Santa Clara, CA (US)

(72) Inventor: Patricio E. Romero, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/962,043

(22) Filed: Oct. 7, 2022

(65) Prior Publication Data

US 2023/0058025 A1    Feb. 23, 2023

Related U.S. Application Data

(63) Continuation of application No. 16/328,536, filed as application No. PCT/US2016/055067 on Oct. 1, 2016, now Pat. No. 11,512,098.

(51) Int. Cl.
| | |
|---|---|
| C07F 5/00 | (2006.01) |
| C23C 16/30 | (2006.01) |
| C23C 16/40 | (2006.01) |
| C23C 16/455 | (2006.01) |
| H01L 21/02 | (2006.01) |
| H01L 29/51 | (2006.01) |

(52) U.S. Cl.
CPC ............ *C07F 5/003* (2013.01); *C23C 16/305* (2013.01); *C23C 16/40* (2013.01); *C23C 16/45553* (2013.01); *H01L 21/0228* (2013.01); *H01L 21/02205* (2013.01); *H01L 29/517* (2013.01)

(58) Field of Classification Search
CPC ....................................................... C07F 5/003
USPC ........................................................ 257/410
See application file for complete search history.

(56) References Cited

U.S. PATENT DOCUMENTS

| | | | |
|---|---|---|---|
| 11,512,098 B2 * | 11/2022 | Romero | ................. C23C 16/40 |
| 2006/0177577 A1 | 8/2006 | Thompson | |
| 2015/0364772 A1 | 12/2015 | Kongkanand | |

FOREIGN PATENT DOCUMENTS

WO    WO 2004-046417    6/2004

OTHER PUBLICATIONS

De Rouffignac, P. et al., "ALD of Scandium Oxide from Scandium Tris (N,N'-diisopropylacetamidinate) and Water" Electrochemical and Solid-State Letters, vol. 9, No. 6, F45-F48. See abstract; pp. F45, F47; and Figure 1b, 2006.

(Continued)

*Primary Examiner* — Christine T Mui
*Assistant Examiner* — Emily R. Berkeley
(74) *Attorney, Agent, or Firm* — Schwabe, Williamson & Wyatt, P.C.

(57) ABSTRACT

Described are precursor compounds and methods for atomic layer deposition of films containing scandium(III) oxide or scandium(III) sulfide. Such films may be utilized as dielectric layers in semiconductor manufacturing processes, particular for depositing dielectric films and the use of such films in various electronic devices.

11 Claims, 4 Drawing Sheets

(56) References Cited

OTHER PUBLICATIONS

International Search Report and Written Opinion for International Patent Application No. PCT/US2016/055067 dated Jun. 14, 2017, 12 pgs.

International Preliminary Report on Patentability for International Patent Application No. PCT/US2016/055067 dated Apr. 11, 2019, 16 pgs.

Milanov, A. P. et al., "Sc2O3, Er2O3, and Y2O3 thin films by MOCVD from volatile guanidinate class of rare—earth precursors", Dalton Transactions, 2012, vol. 41, No. 45, pp. 13936-13947.

Milanov, A. P. et al., "Synthesis, characterization, and thermal properties of homoleptic rare—earth guanidinates: Promising precursors for MOCVD and ALD of rare—earth oxide thin films", Inorganic chemistry, 2008, vol. 47, No. 23, pp. 11405-11416.

* cited by examiner

SCANDIUM PRECURSOR FOR $Sc_2O_3$ OR $Sc_2S_3$ ATOMIC LAYER DEPOSITION

CROSS-REFERENCE TO RELATED APPLICATIONS

This patent application is a continuation of U.S. patent application Ser. No. 16/328,536, filed Feb. 26, 2019, which is a U.S. National Phase Application under 35 U.S.C. § 371 of International Application No. PCT/US2016/055067, filed on Oct. 1, 2016, the entire contents of which are hereby incorporated by reference herein.

TECHNICAL FIELD

The present disclosure relates to scandium precursors for atomic layer deposition of films containing scandium(III) oxide, $Sc_2O_3$ or scandium (III) sulfide, $Sc_2S_3$. The scandium precursors, in liquid form and with relatively high thermal stability and relatively high vapor pressure, are conveniently sourced from amidinate-based ligand structures. The films are then employed in semiconductor manufacturing processes, particularly for depositing dielectric films and use of such films in various electronic devices.

BACKGROUND

Atomic layer deposition (ALD) has emerged as a popular technology for the preparation of highly conformal, ultra-thin films. More specifically, ALD has been employed for the deposition of electrically insulating materials with high dielectric constants (high-k dielectrics) as gate insulators in high-speed transistors as well as ultrathin gate interlayers in the integration of new channel materials.

Successful precursors for deposition are preferably volatile, thermally stable and highly reactive. Identifying new and more efficient compounds that satisfy these requirements remains challenging. With regards to high-k dielectric oxides based on $Sc_2O_3$, many current precursors lack such requirements suitable for ALD processing.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Although the following Detailed Description will proceed with reference being made to illustrative embodiments, many alternatives, modifications and variations thereof will be apparent to those skilled in the art.

DETAILED DESCRIPTION

The present disclosure is directed to scandium precursors suitable for atomic layer deposition (ALD) of films containing scandium(III) oxide, $Sc_2O_3$ or scandium (III) sulfide, $Sc_2S_3$. In an embodiment of the present disclosure the precursor is an amidinate type scandium precursor and has the following structural formula:

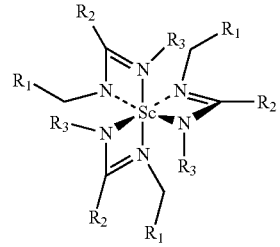

wherein $R_1$, $R_2$ and $R_3$ are selected from the group consisting of alkyls, allyls, aryls, heteroaryls, hydrogen, non-metals and metalloids and where $R_1$, $R_2$ and $R_3$ are different or the same. Accordingly, in the context of the present disclosure, the amidinate type scandium precursor herein may be identified as $Sc(Amid-R_1, R_2, R_3)_3$. Alternatively, one may identify the amidinate precursor herein as $Sc(Amid-Et,Me)_3$ in that situation where an ethyl group and methyl group serve as the source for the selection of $R_1$, $R_2$ and $R_3$.

Accordingly, $R_1$, $R_2$ and $R_3$ are preferably selected from alkyls, including methyl, ethyl and/or propyl group functionality. In one further preferred embodiment, the amidinate type scandium precursor herein may therefore have the following structure, which may be abbreviated herein as $Sc(Amid-Me)_3$:

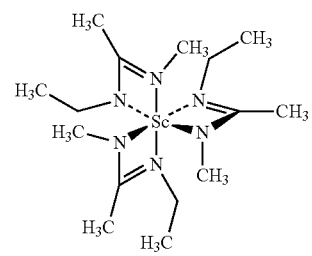

The amidinate type scandium precursor herein is preferably prepared according to the following general scheme, where $R_1$, $R_2$ and $R_3$ may be as described above:

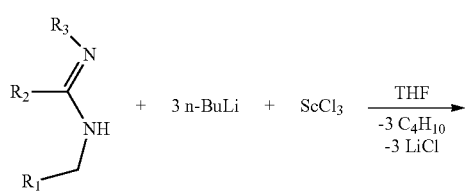

-continued

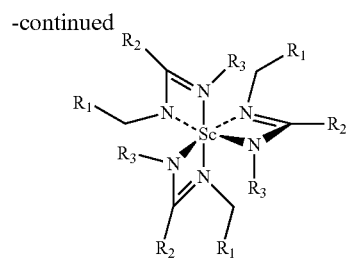

Figure 1:
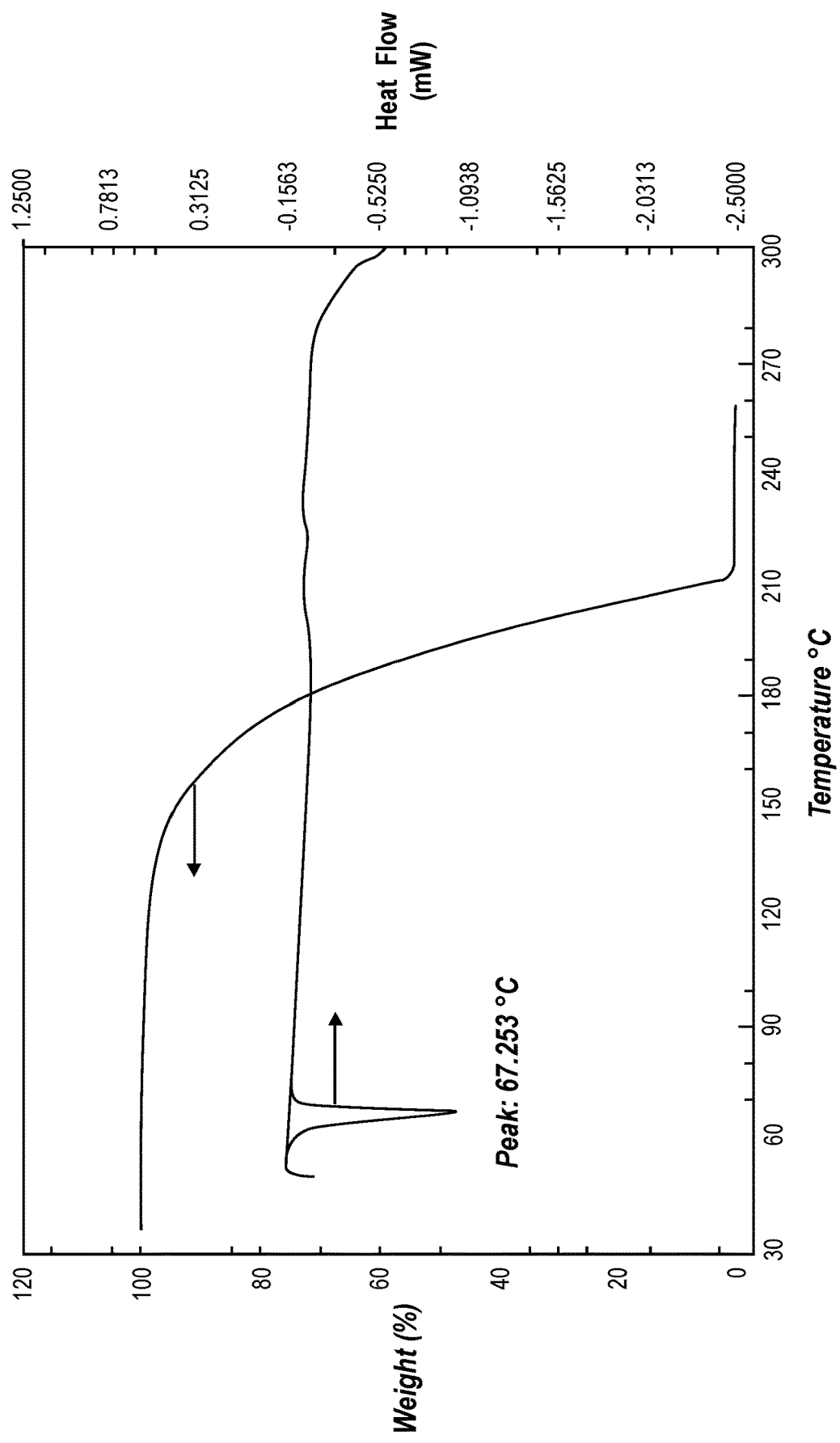
FIG. 1 indicates a combined Thermal Gravimetric Analysis (TGA) and Differential Scanning calorimetry trace of the amidinate type scandium precursor in accordance with the present disclosure.

The amidinate type scandium precursors herein provide a very useful combination of dielectric (k) values, thermal stability and processing capability. Attention is directed to FIG. 1 which provides a Thermal Gravimetric Analysis (TGA) and Differential Scanning calorimetry analysis (DSC) for the amidinate type scandium precursor Sc(Amd-Et,Me)$_3$. As can be seen, the TGA curve shows what may be identified as a clean evaporation profile with near zero residue at a temperature of 210° C. (≤0.1% wt.). It may therefore be appreciated that the amidinate type scandium precursors herein are such that they indicate thermal stability (no breakdown of the structure) in the temperature range of 30° C. to 210° C., in the absence of any co-reactant.

The DSC curve in FIG. 1 indicates an endothermic transition centered around 67.2° C. which corresponds to the solid-liquid transition (melting) which occurs prior to the onset of evaporation. Accordingly, in the broad context of the present disclosure, it is contemplated that the amidinate type scandium precursors herein indicates a DSC melting temperature of 67.2° C., plus or minus 5° C. The heating rate in the DSC is preferably in the range of 5-10° C./minute. The TGA and DSC evaluation illustrated in FIG. 1 therefore confirms the ability to provide the amidinate type scandium precursors herein in liquid form as well as suitable evaporation characteristics for use in ALD processing.

Figure 2:
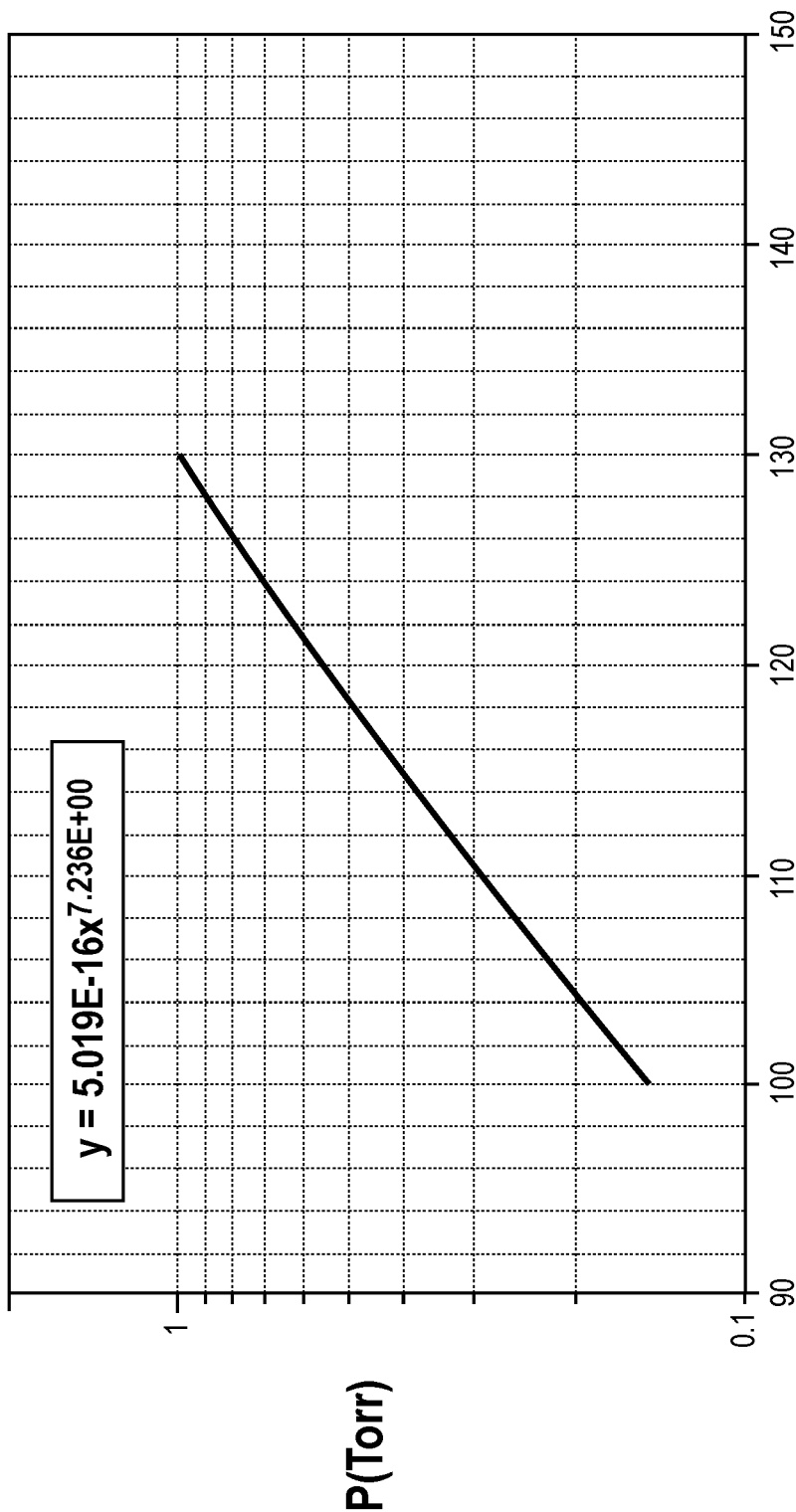
FIG. 2 indicates a Thermal Gravimetric Analysis vapor pressure curve under isothermal conditions of the amidinate type scandium precursor in accordance with the present disclosure.

FIG. 2 indicates a Thermal Gravimetric Analysis vapor pressure curve under isothermal conditions for the amidinate type scandium precursor Sc(Amid-Me, Et)$_3$. As can be seen, the precursor indicates a vapor pressure of 0.1 Torr at about 95° C. and a vapor pressure of 1.0 Torr at 130° C. It is therefore the case that the amidinate type scandium precursors herein indicate a vapor pressure of 0.1 Torr to 1.0 Torr over the temperature range of 95° C. to 130° C. Such vapor pressure characteristics are again now suitable for use of the precursors herein for ALD reactors.

Figure 3:
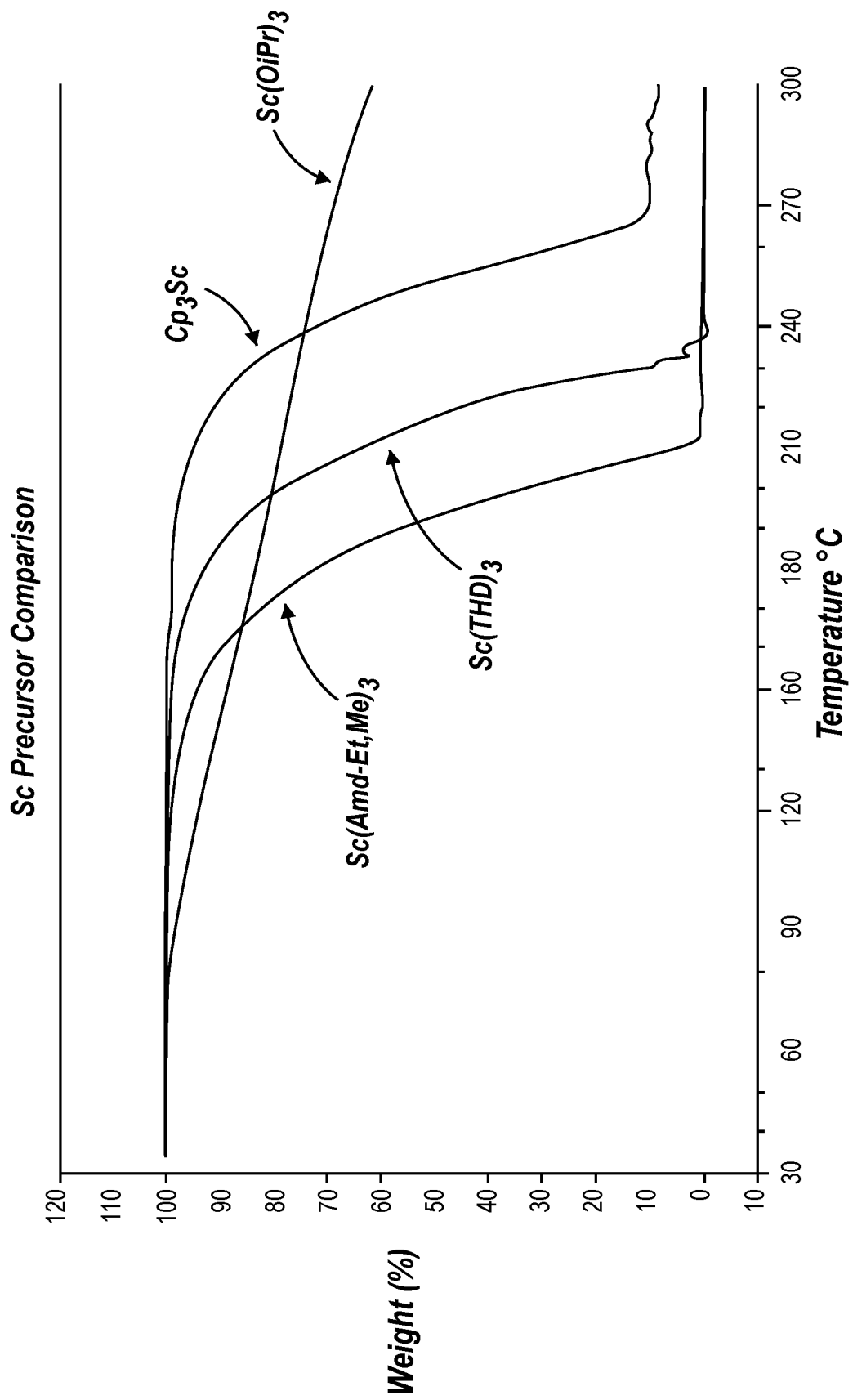
FIG. 3 indicates a Thermal Gravimetric Analysis (programmed heating) of the amidinate type scandium precursor herein versus $Cp_3Sc$ (Cp=cyclopentadienyl), $Sc(THD)_3$ (THD=2,2,6,6-tetramethyl-3,4-heptanedionato) and $Sc(OiPr)_3$ (OiPr=isopropoxide).

FIG. 3 next indicates a Thermal Gravimetric Analysis (programmed heating) of the amidinate type scandium precursor herein versus Cp$_3$Sc (Cp=cyclopentadienyl), Sc(THD)$_3$ (THD=2,2,6,6-tetramethyl-3,4-heptanedionato) and Sc(OiPr)$_3$ (OiPr=ispropoxide). This comparison confirms that the amidinate type scandium precursors herein are relatively more volatile than the other identified scandium precursors, which other precursors also indicated decomposition before volatization appeared to take place, as indicated in part by the erratic behavior at the end of the TGA scan.

Figure 4:
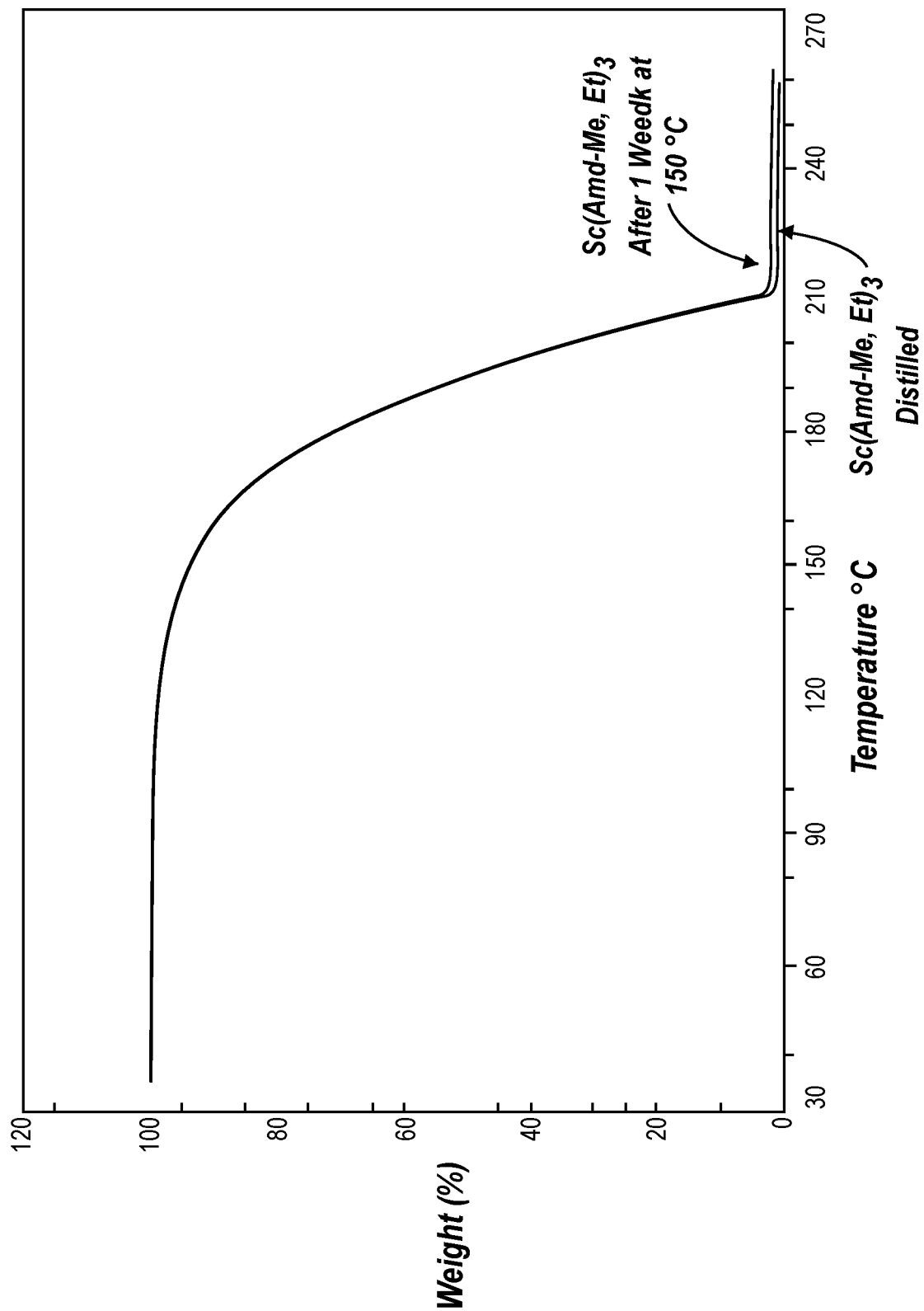
FIG. 4 indicates a comparative Thermal Gravimetric Analysis of freshly distilled amidinate type scandium precursor herein compared to a sample of such precursor subjected to prolonged and sustained heating at 150° C. for one week.

FIG. 4 indicates a comparative Thermal Gravimetric Analysis of the freshly distilled amidinate type scandium precursor (Sc(Amd-Me,Et)$_3$ herein compared to a sample of such precursor subjected to prolonged and sustained heating at 150° C. for one week. As can be observed, there is essentially no change in evaporation profiles which therefore confirms the thermal stability of the amidinate type scandium precursors disclosed herein.

As alluded to above, the amidinate type scandium precursors herein may be utilized for atomic layer deposition (ALD), which is a thin-film deposition technique based on the precursors herein which may react with a surface followed by removal of unreacted molecules, followed by introduction of a co-reactant, such as water or hydrogen sulfide (H$_2$S), which leads to thin film deposition of either Sc$_2$O$_3$ or Sc$_2$S$_3$. Accordingly, during a preferred ALD process a heated substrate (e.g. a substrate temperature in the range of 200° C. to 500° C.) can be repeatedly exposed to (a) the amidinate type scandium precursor herein; (b) a chamber purge to remove excess precursor plus any by-products; (c) a co-reactant; and (d) a final chamber purge to remove reaction by products. It is contemplated herein that films containing Sc$_2$O$_3$ or Sc$_2$S$_3$ may therefore now be formed having thicknesses of less than or equal to 300 Angstroms, or in the range of 5 Angstroms to 300 Angstroms.

The films containing Sc$_2$O$_3$ or Sc$_2$S$_3$ herein when combined with rare earth elements (Y, Gd, La) are further contemplated to produce ternary rare earth scandates of the formula (REScO$_3$ or REScS$_3$) where RE stands for rare earth. Such ternary scandates are contemplated to have thermal stabilities to 900° C. and dielectric k values of up to 22, which therefore make them suitable as gate insulators for in relatively high speed transistors as well as gate interlayer materials in the integration of new channel materials. In addition, the films herein containing Sc$_2$O$_3$ or Sc$_2$S$_3$ formed from the amidinate type scandium precursors herein are such that they can incorporate nitrogen at levels of 0.5 at. % to 10.0 at. %, which can be measured by X-ray photoelectron spectroscopy (XPS).

A semiconductor process flow may therefore utilize the films disclosed herein for formation of high-k metal gate transistors, for instance. For example, during a gate replacement process a film comprising the ternary scandates herein (Sc$_2$O$_3$ or Sc$_2$S$_3$) may be formed, e.g., using the scandium precursor herein, directly below the gate electrode to provide a gate dialelectric after dummy gate removal to improve channel performance. Any number of transistor types and/or formation process flows may benefit from a gate dialectric formed using the films disclosed herein, such as complementary metal-oxide-semiconductor (CMOS) transistor semiconductor devices having N-type or P-type configurations, whether configured with thin or thick gates, and with any number of geometries. Moreover, the resulting gate dialelectric herein may be used in various transistor devices including planar and non-planar configurations, e.g., finned transistor configurations such as tri-gate or FinFET devices, multi-gate devices, nanowire/nanoribbon devices, and so on.

The following examples pertain to further embodiments of the present disclosure and may comprise subject material such as a compound or process for forming a film, wherein the film is suitable for use in semiconductor manufacturing processes.

The general exemplary procedure is as follows, with the specific compound examples identified below: under a nitrogen atmosphere, 1.0 g (10 mmol) of the amidine in THF (20 mL) was deprotonated with n-BuLi (1.6 M/hexanes, 6.8 mL, 11 mmol) at 78° C. After the addition was completed, the mixture was warmed to room temperature and stirred for 1 hour. This solution was then added via cannula to a −78° C. flask containing solid ScCl$_3$(THF)3(1.22 g, 3.33 mmol) and the mixture was allowed to slowly warm up overnight. The volatiles were vacuum removed and the residue extracted into hexanes (30 mL) and filtered. The colorless residue obtained was bulb-to-bulb distilled at 120-130° C. using a −78° C. receiving flask. The final complex was isolated as a white solid (m.p. 64-67° C. determined by DSC) at about 80% yield. Accordingly, in the broad context of the present disclosure, the yields herein of the subject amidinate type scandium precursors are clearly at a level of at least 50%, more preferably at least 60%, or at least 70%, as well as up to at least 80%. It may therefore be understood that the yields herein of the amidinate type scandium precursor may also be described as falling in the range of 50% to 80%, 60% to 80%, or 70% to 80%.

Example 1

According to this example there is provided a compound having the structural formula:

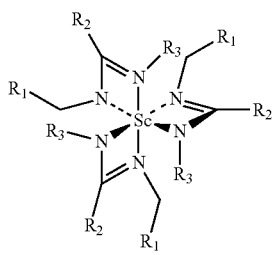

wherein $R_1$, $R_2$ and $R_3$ are selected from the group consisting of alkyls, allyls, aryls, heteroaryls, hydrogen, non-metals and metalloids and where $R_1$, $R_2$ and $R_3$ are different or the same.

Example 2

This example includes the elements of example 1 wherein $R_1$, $R_2$ and $R_3$ are selected from the group consisting of alkyls selected from methyl, ethyl and/or propyl groups.

Example 3

This example includes the elements of example 1 wherein $R_1$, $R_2$ and $R_3$ are methyl groups.

Example 4

This example includes the elements of example 1 wherein $R_1$, $R_2$ and $R_3$ are selected from methyl and ethyl groups.

Example 5

This example includes the elements of example 1 wherein the compound indicates a vapor pressure of 0.1 Torr to 1.0 Torr over the temperature range 95° C. to 130° C.

Example 6

This example includes the elements of example 1 wherein the compound has a melting point of 67.2° C., plus or minus 5° C.

Example 7

According to this example there is provided a process for forming a film comprising
(a) exposing a heated surface to the vapor of the following compound:

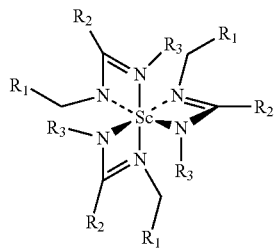

wherein $R_1$, $R_2$ and $R_3$ are selected from the group consisting of alkyls, allyls, aryls, heteroaryls, hydrogen, non-metals and metalloids and where $R_1$, $R_2$ and $R_3$ are different or the same;
(b) exposing the substrate to a co-reactant; and
(c) forming a film on the surface of said substrate wherein said film includes $Sc_2O_3$ or $Sc_2S_3$.

Example 8

This example includes the elements of example 7 wherein $R_1$, $R_2$ and $R_3$ are selected from the group consisting of alkyls selected from methyl, ethyl and/or propyl groups.

Example 9

This example includes the elements of example 7 wherein $R_1$, $R_2$ and $R_3$ are methyl groups.

Example 10

This example includes the elements of example 7 wherein $R_1$, $R_2$ and $R_3$ are selected from methyl and ethyl groups.

Example 11

This example includes the elements of example 7 wherein the film has a thickness of 10 Angstroms to 300 Angstroms.

Example 12

This example includes the elements of example 7 wherein the compound indicates a vapor pressure of 0.1 Torr to 1.0 Torr over the temperature range 95° C. to 130° C.

Example 13

This example includes the elements of example 7 wherein the compound has a melting point of 67.2° C., plus or minus 5° C.

Example 14

This example includes the elements of example 7 wherein the co-reactant comprises water.

Example 15

This example includes the elements of example 7 wherein the co-reactant comprises hydrogen sulfide ($H_2S$).

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

The invention claimed is:

1. A compound having the structural formula:

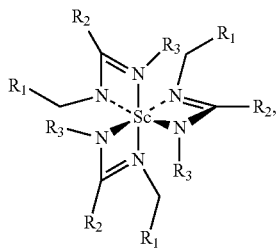

wherein $R_1$, $R_2$ and $R_3$ are selected from the group consisting of alkyls, allyls, aryls, heteroaryls, hydrogen, non-metals and metalloids and where $R_1$, $R_2$ and $R_3$ are different or the same, and wherein $R_3$ is a group different from an $R_1$—$CH_2$— group.

2. The compound of claim 1, wherein $R_1$ is an alkyl group.

3. The compound of claim 1, wherein $R_1$ is selected from the group consisting of allyls, aryls, heteroaryls, hydrogen, non-metals and metalloids.

4. The compound of claim 1, wherein $R_2$ is selected from the group consisting of alkyls selected from methyl, ethyl or propyl groups.

5. The compound of claim 1, wherein $R_3$ is selected from the group consisting of alkyls selected from methyl, ethyl or propyl groups.

6. The compound of claim 1, wherein $R_2$ is a methyl group.

7. The compound of claim 1, wherein $R_3$ is methyl group.

8. The compound of claim 1, wherein $R_2$ is selected from methyl or ethyl groups.

9. The compound of claim 1, wherein $R_3$ is selected from methyl or ethyl groups.

10. The compound of claim 1, wherein said compound indicates a vapor pressure of 0.1 Torr to 1.0 Torr over the temperature range 95° C. to 130° C.

11. The compound of claim 1, having a melting point of 67.2° C., plus or minus 5° C.

* * * * *